United States Patent
Halm et al.

(10) Patent No.: US 11,398,398 B2
(45) Date of Patent: Jul. 26, 2022

(54) ELECTROSTATIC HOLDING APPARATUS AND METHOD FOR ITS PRODUCTION

(71) Applicant: Berliner Glas KGaA Herbert Kubatz GmbH & Co., Berlin (DE)

(72) Inventors: Simon Halm, Berlin (DE); Lars Ziegenhagen, Berlin (DE)

(73) Assignee: ASML NETHERLANDS B.V., Veldhoven (NL)

(*) Notice: Subject to any disclaimer, the term of this patent is extended or adjusted under 35 U.S.C. 154(b) by 97 days.

(21) Appl. No.: 16/504,227

(22) Filed: Jul. 6, 2019

(65) Prior Publication Data

US 2020/0013660 A1  Jan. 9, 2020

(30) Foreign Application Priority Data

Jul. 6, 2018 (DE) .......................... 102018116463.7

(51) Int. Cl.
    *H01L 21/683* (2006.01)
(52) U.S. Cl.
    CPC ................. *H01L 21/6833* (2013.01)
(58) Field of Classification Search
    CPC ............. H01L 21/6833; H01L 21/6875; H01L 21/68757
    See application file for complete search history.

(56) References Cited

U.S. PATENT DOCUMENTS

| 4,645,218 A * | 2/1987 | Ooshio ............... H01L 21/6831 269/13 |
| 5,099,571 A * | 3/1992 | Logan ................. H01L 21/6831 29/825 |
| 9,673,079 B2 | 6/2017 | Baldus |

(Continued)

FOREIGN PATENT DOCUMENTS

| JP | 2010161319 A | 7/2010 |
| KR | 1020090129761 A | 12/2009 |

(Continued)

OTHER PUBLICATIONS

English Abstract for JP 2010161319 A (2010).

(Continued)

*Primary Examiner* — Thienvu V Tran
*Assistant Examiner* — Bart Iliya
(74) *Attorney, Agent, or Firm* — Caesar Rivise, PC

(57) ABSTRACT

Holding apparatus 100 for electrostatic holding of component 1, in particular a silicon wafer, includes plate-type base body 10 with plurality of projecting burls 11, the front surfaces 12 of which span a burl support plane for component 1, and electrode device 20 arranged in layered form in spacings between burls 11 and has plastic insulating layer 21 connected with base body 10, electrode layer 22 and dielectric layer 23, whereby electrode layer 22 is arranged between insulating layer 21 and dielectric layer 23, whereby a predetermined gap spacing A is set between the burl support plane and a top side of dielectric layer 23, and dielectric layer 23 includes an inorganic dielectric and is embedded at least in part into insulating layer 21. Methods for producing holding apparatus 100 for electrostatic holding of component 1, in particular a silicon wafer, are also described.

17 Claims, 2 Drawing Sheets

(56) References Cited

U.S. PATENT DOCUMENTS

| | | |
|---|---|---|
| 2004/0117977 A1* | 6/2004 | Hiramatsu .......... H01L 21/6875 |
| | | 29/611 |
| 2007/0146679 A1 | 6/2007 | Sutedja et al. |
| 2009/0079525 A1 | 3/2009 | Sijben |
| 2012/0274920 A1 | 11/2012 | Bex et al. |
| 2013/0094009 A1 | 4/2013 | Lafarre et al. |
| 2013/0126226 A1 | 5/2013 | Koster et al. |
| 2013/0308116 A1 | 11/2013 | Helmus et al. |
| 2015/0348816 A1 | 12/2015 | Stein |
| 2016/0354864 A1 | 12/2016 | Hammer et al. |
| 2018/0047605 A1 | 2/2018 | Gratrix et al. |

FOREIGN PATENT DOCUMENTS

| | | |
|---|---|---|
| WO | 2012005294 A1 | 1/2012 |
| WO | 2014154428 A2 | 10/2014 |

OTHER PUBLICATIONS

English Abstract for KR 1020090129761 A (2009).
Search Report for counterpart GB App. No. 1909561.1 dated Nov. 28, 2019.

* cited by examiner

ELECTROSTATIC HOLDING APPARATUS AND METHOD FOR ITS PRODUCTION

CROSS-REFERENCE TO RELATED APPLICATIONS

This application claims priority from DE 10 2018 116 463.7 filed Jul. 6, 2018, the contents of which are incorporated herein by reference in their entireties for all purposes.

BACKGROUND OF THE INVENTION

The invention relates to a holding apparatus for electrostatic holding of a component, in particular a semiconductor wafer. The invention relates also to methods for the production of the holding apparatus. Applications of the invention exist in the provision of machines or tools for holding components by means of electrostatic forces, in particular for holding semiconductor wafers, such as for example silicon wafers.

An electrostatic holding apparatus, which is also referred to as electrostatic clamping apparatus, electrostatic clamp (ESC) or electrostatic chuck, generally has a plate-type base body to receive the component and an electrode device to generate an electrostatic holding force or, with reference to the area, an electrostatic clamping pressure. The base body can generally be constructed in one piece comprising one plate or in multilayer form from multiple plates. The base body is provided on at least one surface with projecting burls, the front surfaces of which span a burl support plane. The burl support plane defines the support surface for the held component.

The electrode device comprises a plurality of electrodes, with which the electrostatic clamping pressure is generated through application of an electrical voltage. The electrostatic clamping pressure depends in particular on the voltage, on the spacing of the electrodes from the burl support plane and on the dielectric properties of the material composition in this spacing. The latter comprises the dielectric above the electrodes with given layer thickness and relative permittivity $\varepsilon_{r,d}$ and the free gap spacing, filled with a gas with permittivity $\varepsilon_{r,g}$, between the burl support plane and the top side of the holding apparatus between the burls. Because the ratio $\varepsilon_{r,d}$ $\varepsilon_{r,g}$ is typically considerably greater than 1, the electrostatic clamping pressure is as a rule determined substantially by the gap spacing. In order to achieve a high and homogeneous clamping pressure, there is therefore a particular interest in a gap spacing that is as small and constant as possible over the area of the holding apparatus.

There are two types of electrostatic clamps. In a first variant the insulator, electrode and dielectric are applied in layers, one over the other over their full area, onto a base body. Because the material of the base body in this variant does not protrude through the individual layers, the burls on the clamp surface must be produced from the material of the dielectric, which is as a rule sensitive glass. In a second variant the insulating layer is inserted together with the electrode and the dielectric between the burl structures of a base body. If a material that is considerably harder than glass, e.g. SiSiC, is chosen for the base body, the mechanical strength of the burls and thus of the support surface is improved substantially.

Basically a complex multi-layer construction results in a long, almost fully serial process chain with high costs, limited output, a high level of input and high costs due to reworking in manufacturing and a long delivery time. If the burls consist of a soft dielectric material (e.g. glass), they have a lower wear resistance than ceramic burls. In this case additionally applied wear-resistant protective layers increase the manufacturing input even more and they need to be renewed in regular cycles.

An apparatus according to the aforementioned first variant of electrostatic clamps is described in US 2015/0348816 A1. Here, a dielectric disc coated with an electrode is bonded over the full area onto a base body. The adhesive is chosen, such that, apart from its adhesive properties, it also serves as insulator between base body and electrode. In the case of the apparatus described in US 2015/0348816 A1 the burl support surface is introduced in the dielectric. In the case of this apparatus the bonding of the dielectric disc over the full area, as a result of which the adhesive is also located below the individual burls, can have disadvantageous effects. Shrinkage or ageing of the adhesive polymer can result in a change of position of the burl in z direction and thus change the evenness on the clamp support surface in a disadvantageous way. Furthermore it is described in US 2015/0348816 A1, that the adhesive levels out unevennesses between dielectric and base body. That can however lead to there being different thicknesses of adhesive layer under the individual burls and thus to variations in the compressibility of the individual burls, which can likewise have an effect on the evenness of the support surface in the subsequent operation of the apparatus and in the action of a clamping pressure.

A holding apparatus, in which the electrode device is not integrated into the base body, but is arranged on its surface between the burls (burl base), is described for example in US 2009/0079525 A1 and in US 2013/0308116 A1. In this case the electrode device comprises a layer construction between adjacent burls with a lower plastic insulating layer, in the top side of which the electrodes are inserted, and a dielectric layer consisting of a plastic or glass, which extends over the insulating layer with the electrode. This configuration represents a proposal for the arrangement of the electrodes between the burls, whereby no methods are disclosed for how the layer construction is to be produced on a holding apparatus for practical applications with e.g. multiple thousand burls. A particular disadvantage is that no setting of the spacing of the electrodes from the burl support plane or of the gap spacing is provided, so the electrostatic clamping pressure can vary over the area of the holding apparatus.

For the production of an electrostatic holding apparatus it is known from U.S. Pat. No. 9,673,079 B1 to provide the electrode device as separate component with a self-supporting silicon disc, electrode layers on the silicon disc and a covering SiN dielectric layer. The silicon disc has holes to receive the burls of the base body. To connect the electrode device with the base body the silicon disc is bonded onto the base body, whereby the burls protrude through the holes of the electrode device. In this method particular advantages do result from the separate production of the electrode device and its simple connection with the base body. It can however be of disadvantage that e.g. variations of the gap spacing over the electrode device can arise owing to thickness fluctuations of the adhesive bond between the electrode device and the base body. Moreover it is necessary that the silicon disc is as thin as possible or the burl height is as large as possible, which leads to complex, time-consuming processing.

According to US 2012/0274920 A1 it is proposed to produce the electrode device with thin-film technology in the spacings between the burls. On the base body there is formed first between the burls a planarization layer, on which a polymer- or $SiO_x$-based insulating layer, the electrode layer and a polymer- or $SiO_x$-based dielectric layer are deposited. The planarization layer does allow planarization of the electrode device with this technology. It can however be of disadvantage that also in this case variations of the gap spacing and thus of the electrostatic clamping pressure arise owing to fluctuations in the thin-film deposition. Moreover the thin films are susceptible to damage during use of the holding apparatus.

To prevent fluctuations in the gap spacing it is proposed in US 2018/0047605 A1 to form the electrode device in the spacings between the burls by means of a polymer-based insulating layer, electrode layers on the insulating layer and a covering, polymer-based dielectric layer. Variations in the gap spacing are to be excluded through setting of the top sides of the insulator and dielectric layers respectively with a reference tool before curing. With this technology fluctuations in the holding forces due to variations in the gap spacing are prevented.

A disadvantage of the technology described in US 2018/0047605 A1 results however from the plurality of work steps that have to be performed successively. A further, even more important disadvantage exists owing to the use of polymers for the formation of the insulator and dielectric layers. Polymeric plastics have a limited chemical and/or physical resistance under the operating conditions of electrostatic holding apparatus, in particular in the processing of semiconductor wafers. Unwanted substances can be released and/or ageing processes of the polymers can limit the useful life of the holding apparatus.

The aforementioned problems arise not only in respect of holding apparatus for holding semiconductor wafers, but also in respect of other applications, e.g. in respect of holding apparatus for holding glass plates.

The objective of the invention is to provide an improved holding apparatus for electrostatic holding of a component, in particular a semiconductor wafer, with which disadvantages of conventional technologies are avoided. The holding apparatus should in particular make it possible to minimize or completely prevent variations in the gap spacing along the burl support plane, to minimize or completely prevent disadvantages due to the use of polymeric plastics, and/or to produce the holding apparatus with a simplified method. The objective of the invention is moreover to provide a method for the production of an electrostatic holding apparatus, with which disadvantages of conventional technologies are avoided. The method should in particular be distinguished by a simplified production of the holding apparatus and/or make possible a reliable setting of the gap spacing along the burl support plane.

These objectives are achieved by an electrostatic holding apparatus and a method for the production of an electrostatic holding apparatus of the invention.

BRIEF SUMMARY OF THE INVENTION

According to a first general aspect of the invention the aforementioned objective is achieved by an electrostatic holding apparatus for electrostatic holding of a component, in particular a semiconductor wafer, e.g. a silicon wafer, comprising a plate-shaped base body and an electrode device. The base body is made up of one or more plates and provided on at least one plate surface with projecting burls. Plane front surfaces of the burls are arranged in a common burl support plane. During operation of the holding apparatus the component to be held lies on the front surfaces of the burls.

The electrode device is arranged in layered form in spacings between the burls, i.e. on the burl base. The electrode device comprises a plastic insulating layer on the burl base, an electrode layer with at least one electrode and a dielectric layer. The insulating layer is connected with the base body, and it carries the electrode layer. The plastic of the insulating layer is a curable plastic (curable in particular thermally and/or in a radiation-induced manner and/or in a solvent-induced manner), the state of which is settable as a flowable or a cured state. The dielectric layer covers the electrode layer on the insulating layer. The perpendicular spacing between the top side of the holding apparatus between the burls, in particular between the top side (side facing away from the base body) of the dielectric layer, and the burl support plane forms the gap spacing of the holding apparatus, i.e. in particular the spacing between the topmost, exposed surface of the dielectric layer (or an optional further layer provided thereon) and the surface of the held component facing towards the base body.

According to the invention the dielectric layer is formed of an inorganic dielectric. The use of an inorganic dielectric has multiple advantages. Firstly the dielectric properties of inorganic dielectrics, e.g. of glass, are well known. In particular dielectrics such as alkali-ion-free glasses are available. Alkali-ion-free glasses advantageously make possible a quick switching and reloading of the holding apparatus with the prevention of electrical relaxation effects. Moreover the dielectric layer represents a cover of the plastic insulating layer, so the plastic is protected from chemical and/or physical influences during the operation of the holding apparatus. Disadvantages of the types arising in the use of polymeric plastics e.g. according to US 2018/0047605 A1, can be prevented.

Moreover the dielectric layer of the electrode device is embedded at least in part into the insulating layer. The embedding of the dielectric layer means that this protrudes at least partially into the insulating layer in thickness direction. The embedding makes it possible for the gap spacing of the holding apparatus to be formed independently of the thickness of the insulating layer. The at least partial embedding of the dielectric layer into the insulating layer makes production of the holding apparatus with a precisely set gap spacing possible.

The holding apparatus according to the invention has moreover the following advantages. The homogeneity of the clamping pressure required in particular in the processing of semiconductor components is improved in comparison with conventional technologies. Inherent limitations e.g. of the conventional thin-film technologies in relation to the achievable global and local layer thickness homogeneity on the required workpiece diameter and the additional need for the levelling-out of existing unevennesses of the base body relative to the plane of the burl surfaces are overcome. Moreover functional limitations of conventional holding apparatus with regard to the chemical and physical resistance of plastics, e.g. in relation to cleaning media, atmospheric humidity, EUV radiation and local mechanical load, are overcome and a better definition of the dielectric properties that define the clamping-pressure dynamics is achieved.

According to a preferred embodiment of the holding apparatus according to the invention the dielectric layer is formed of a shape-retentive, self-supporting dielectric disc. Depending on the production method used, the dielectric layer comprises the dielectric disc or a layer of the dielectric disc formed through material removal (thinning). The dielectric layer has a constant thickness, which is preferably at least 60% of the height of the burls over the burl base. For example the thickness of the dielectric disc is chosen in the range from 50 µm to 200 µm. Advantageously the use of the shape-retentive dielectric disc makes possible its alignment relative to the burl support plane and thus the precise setting of the gap spacing.

The dielectric layer has holes, through which the burls of the base body protrude. According to a further embodiment of the invention a lateral spacing between the dielectric layer and the burls can be formed at the holes. Thus advantageously a space is created to receive plastic in the production of the insulating layer, to receive manufacturing tolerances and for lateral alignment of the dielectric.

The base body of the holding apparatus according to the invention is preferably formed, such that the burl base is shaped flat in the spacings between the burls and in particular runs parallel to the burl support plane in such a way that during the formation of the insulating layer unwanted, extensive cavities are avoided. Particularly preferably the burl base has a structure which promotes the adhesion between the base body and the insulating layer. To this end the base body has in the spacings between the burls a roughness with unevennesses, the height of which over the central level of the burl base is considerably less than the thickness of the insulating layer. Preferably the unevennesses are smaller than 10% of the thickness of the insulating layer. With a thickness of the dielectric layer of e.g. 40 µm projections protruding out of the surface have preferably a height over the central level of the burl base of less than 4 µm. Alternatively or additionally the burl base can have adhesion-promoting depressions (e.g. pores or slots) in the base body. The depressions can extend into the base body deeper than the thickness of the insulating layer. In the production of the holding apparatus the plastic can flow into the depressions and fill the same, so the vacuum stability of the base body is not impaired by the depressions.

According to a further preferred embodiment of the invention the base body, in particular its plate provided with the burls, comprises Si-infiltrated SiC (SiSiC). SiSiC is a ceramic, which owing to its high shape retention and temperature stability has particular advantages for application in an electrostatic holding apparatus. Particularly preferably the base body can have carbon enrichment on the burl base. Advantageously the adhesion between the base body and the plastic of the insulating layer is thus improved. The SiC enrichment can be achieved e.g. through Si removal by means of laser irradiation.

According to a further advantageous embodiment of the invention there can be provided on the burls a cover layer, which covers the front surfaces of the burls and can optionally extend as far as edge sections of the insulating layer or even as far as edge sections of the dielectric layer. The cover layer is preferably formed of DLC (diamond-like carbon) and/or a nitride compound. Advantageously it makes possible an improvement in friction and wear properties of the holding apparatus, an improvement in the reproducibility of the component placement and the reliability of component placement on the burls, and/or an additional protection of the plastic of the insulating layer against physical and/or chemical environmental influences, such as e.g. EUV irradiation in the application of the holding apparatus or cleaning agents.

According to a further advantageous embodiment of the invention the life period and stability of the electrode device can be improved, if the electrode layer has an adhesion-promoting surface, by way of which the electrode layer is connected with the insulating layer. The adhesion-promoting surface comprises preferably an adhesion-promoter layer, e.g. of $SiO_2$ or $Si_3N_4$. Alternatively or additionally the adhesion-promoting surface can be provided by means of a pretreatment of the electrode layer, e.g. the setting of a predetermined roughness. The adhesion-promoter layer between the electrode material and the insulating layer advantageously fulfils a further function apart from improved adhesion. Because a voltage of multiple thousands of volts can be present between the electrode layer and the base body, e.g. a SiSiC base body, during the operation of the holding apparatus, a migration of metal ions into the plastic insulating layer could take place. The adhesion-promoter layer can form a diffusion barrier against this migration.

According to a second general aspect of the invention the aforementioned objective is achieved by means of a method for the production of an electrostatic holding apparatus, in which a plate-shaped base body with a plurality of projecting burls is provided, the plane front surfaces of which span a burl support plane for a component that is to be held, in particular a semiconductor wafer, and an electrode device is produced in spacings between the burls in layered form with a plastic insulating layer on the burl base, an electrode layer and a dielectric layer. The electrode layer is arranged between the insulator and dielectric layers. The electrode device is produced, such that a predetermined gap spacing is set between the burl support plane and the top side of the dielectric layer. Preferably the holding apparatus according to the first general aspect of the invention is produced with the method according to the invention.

According to the invention the production of the electrode device comprises the following steps. First a dielectric disc is provided from an inorganic dielectric. The dielectric disc has recesses with an arrangement according to the arrangement of the burls and on one side the electrode layer. Advantageously the dielectric disc can be provided as a premanufactured component or be produced directly during production of the holding apparatus. The dielectric disc consists preferably of a mechanically sturdy, shape-retentive, self-supporting material. The material chosen as dielectric is preferably one that is chemically and physically inert during application of the holding apparatus, in particular during the processing of semiconductor wafers. The electrode layer comprises one or more electrodes. The electrode layer can optionally be prestructured, so the electrode layer does not extend as far as the recesses of the dielectric disc. Optionally an annular surface section around each of the recesses can be free of the electrode layer.

According to the invention a layer of a flowable, curable plastic is applied onto the surface of the base body provided with the burls and/or onto the side of the dielectric disc provided with the electrode layer. The surface of the base body and/or of the dielectric disc is covered over its area with the flowable, curable plastic.

Thereafter, according to the invention, the dielectric disc is placed onto the base body, such that the burls protrude into the recesses of the dielectric disc. The dielectric disc is placed onto the base body, such that the electrode layer faces the base body and the side of the dielectric disc facing the base body and provided with the electrode layer is aligned relative to the burl support plane. The alignment takes place preferably, as represented below with further details, by a reference tool, with which the dielectric disc is connected, being placed directly onto the burls or by sunken support sections of the dielectric disc itself being placed directly onto the burls. In respect of the alignment of the side of the dielectric disc facing the base body and carrying the electrode layer this is embedded at least in part into the plastic.

When placing of the dielectric disc the plastic is displaced laterally and/or into available space in the area surrounding the burls, whereby a closed plastic layer is formed between the dielectric disc and the base body.

After that, curing of the plastic takes place, to form the plastic insulating layer of the electrode device, e.g. through heat treatment and/or irradiation treatment.

The method according to the invention has the advantage that the setting of the gap spacing is simplified reliably owing to the alignment of the dielectric disc relative to the burl support plane. The configuration of the recesses in the dielectric disc offers multiple advantages. Firstly manufacturing-related deviations between the arrangement of the burls and the arrangement of the recesses can be readily tolerated owing to sufficiently large recesses. Secondly the recesses make it possible for excess plastic to be received during the formation of the insulating layer.

The method according to the invention is characterized in an advantageous manner by a simplified process chain, which results in considerably lower production costs and a considerably shortened delivery time. Advantageously, base bodies with burls of ceramic material with high wear resistance and low manufacturing and reprocessing input can be used. Reworking costs due to any manufacturing defects are reduced substantially. Finally through the use of the inorganic dielectric layer the advantageous properties of inorganic dielectrics, in particular of glass, can be exploited, e.g. in the quick switching of holding forces.

Advantageously the method according to the invention offers various possibilities for the alignment of the dielectric disc relative to the burl support plane. According to a first variant the alignment of the dielectric disc takes place with the use of a reference tool (below: first embodiment of the invention). According to a second variant the dielectric disc is shaped, such that it can be used itself for alignment relative to the burls of the base body (below: second embodiment of the invention).

In the first embodiment of the invention the recesses of the dielectric disc comprise holes in the disc. The holes are arranged, such that the dielectric disc can be placed onto the base body, whereby the burls protrude through the holes. The dielectric disc is connected with a reference tool (or: master tool), with which the placing of the dielectric disc onto the base body and an alignment relative to the front surfaces of the burls take place. The reference tool has a plane reference surface, to which the dielectric disc is fastened. Moreover the reference tool has support sections, on which the reference surface is sunken. The support sections have the shape and arrangement of the holes in the dielectric disc. The support sections are plane sections of the reference surface, which are aligned parallel to the rest of the reference surface and have a perpendicular spacing from the same. The reference tool has an evenness of the reference surface and a depth of the sunken support sections which determine the accuracy of the setting of the gap spacing of the holding apparatus. The reference tool is formed of a material with a stiffness and temperature stability of the type provided for example by Zerodur K20 (product name). For subsequent separation of the dielectric disc from the reference surface the latter can be provided advantageously with an adhesion-reducing coating.

In the first embodiment of the invention the dielectric disc is connected with the reference surface and the reference tool is placed onto the base body, such that the burls protrude through the holes in the dielectric disc and touch the support sections of the reference tool. In other words, the support sections of the reference tool lie on the front surfaces of the burls. Thus advantageously the side of the dielectric disc facing the base body and in particular also its side facing away from the base body is aligned relative to the burl support plane. The dielectric disc is pressed with the reference tool into the not yet cured plastic between the surface of the base body and the dielectric disc.

According to a particularly preferred variant of the first embodiment of the invention the dielectric layer is formed by the dielectric disc itself. The gap spacing is defined by the depth of the support sections relative to the reference surface of the reference tool. Advantageously finishing of the dielectric disc is not necessary.

In the second embodiment of the invention the recesses of the dielectric disc do not form through holes, but depressions in the side of the dielectric disc provided with the electrode layer. The depressions have plane bottom surfaces, which extend parallel to the extension of the dielectric disc.

Projections protruding into the depression (so called counter-burls) can be provided on the bottom surfaces. The provision of the counter-burls has the advantage, that additional volume is created to receive plastic. The counter-burls can be larger than, of the same size as or smaller than the burls of the base body. An essential function of the counter-burls in the mechanical thinning of the dielectric is to open the holes in the positions of the burls even before the dielectric has been thinned to the burl plane. Thus it is possible to be able to remove again any scratches on the surface of the dielectric, caused by material break-out during the opening of the drilled holes, during the remaining processing, which is still to the carried out, i.e. until the burl level is reached. Counter-burls can also be provided on the support sections of the reference tool in the first embodiment of the invention.

The depressions are configured, such that, when the dielectric disc is placed onto the base body, the burls protrude into the depressions and the front surfaces of the burls touch the bottom surfaces or the optionally provided counter-burls. The dielectric disc is supported on the bottom surfaces or the counter-burls by the burls. In the second embodiment the dielectric disc placed onto the base body is pressed against the base body, such that the dielectric disc is embedded into the plastic.

After curing of the plastic and formation of the insulating layer in the second embodiment of the invention the dielectric disc is thinned with an abrasive method, in order to form the dielectric layer. The dielectric disc is milled uniformly over its area, until the burls are exposed and the gap spacing is formed.

Preferably the thinning of the dielectric disc is done with a two-stage method, whereby in a first phase the dielectric disc is removed, e.g. by means of a grinding and/or polishing method, until the front surfaces of the burls are exposed. Because the burls are formed of a material such as for example SiSiC, which is harder than the dielectric of the dielectric disc, the burls can be used as reference for the thinning of the dielectric disc in the first phase. Thereafter in a second phase an etching method is applied, in order to set the gap spacing. The inventors have found that the subsequent thinning of the dielectric disc is possible advantageously with such a homogeneity, that the gap spacing can be set constant over the entire area of the base body.

According to an advantageous variant of the second embodiment of the invention, after the formation of the dielectric layer through the thinning of the dielectric disc, edge sections of the insulating layer, which abut the burls and are exposed between the burls and the dielectric layer, can be removed, so a perpendicular spacing is formed between the burl support plane and the surface of the insulating layer in the edge sections.

BRIEF DESCRIPTION OF THE DRAWINGS

Further details and advantages of the invention are described below with reference to the attached drawings, where the following are shown.

DETAILED DESCRIPTION OF PREFERRED EMBODIMENTS

Preferred embodiments of the invention are described below with exemplary reference to features of an electrostatic holding apparatus for silicon wafers, which is shown schematically, not true to scale. The implementation of the invention is not limited to this application. Other applications of the holding apparatus are conceivable, e.g. in the holding of glass plates with metal coatings, or of exposure masks, whereby for other applications the design of the base bodies, in particular of the burls, the materials and the dimensions of the electrode device are adapted to the specific requirements. Notwithstanding the illustration the base body can comprise a single plate or be produced in multilayer form from multiple partial plates. Moreover for practical applications of the holding apparatus in the handling of semiconductor wafers the base body is provided on both sides with burls and in each case with an electrode device. Details of the specific configuration of the electrodes along the holding surface of the holding apparatus are not described, as these are known per se from conventional holding apparatus and can be chosen depending on the specific task of the holding apparatus. Finally, the figures do not show true-to-scale illustrations of holding apparatus, but clarify in particular the provision of the electrode device in the spacings between the burls of the base body.

The structure of the base body of the holding apparatus can be chosen in the manner that is well known from conventional holding apparatus. The holding apparatus can be configured e.g. as monopolar or bipolar holding apparatus. Details concerning the control of the holding apparatus temperature and the application of electrical voltages to generate electrostatic holding forces are not described, as these are known per se from conventional holding apparatus.

Figure 1:
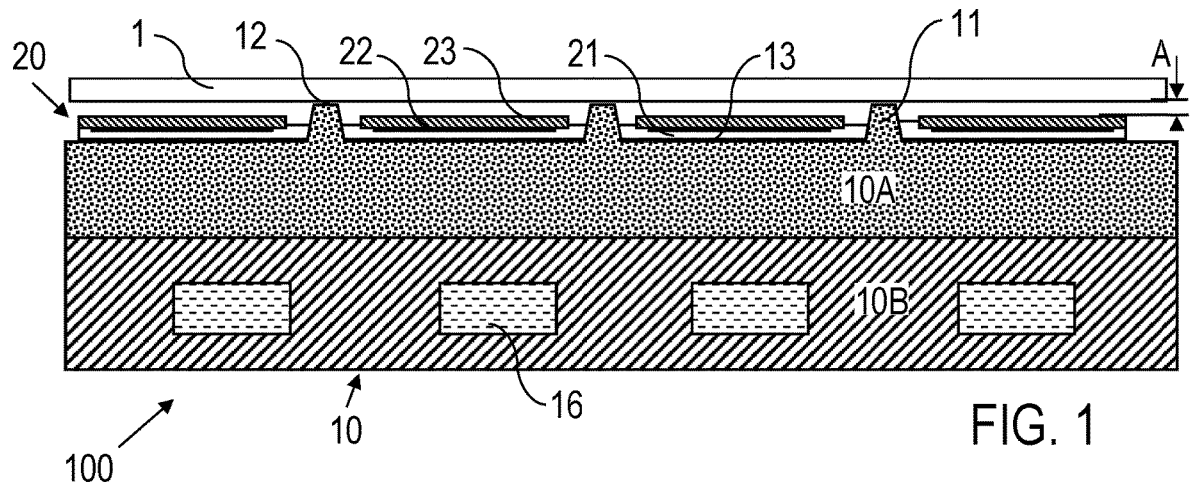
FIG. 1: a schematic sectional view of an embodiment of the electrostatic holding apparatus according to the invention.

FIG. 1 illustrates in schematic sectional view a preferred embodiment of the electrostatic holding apparatus 100 according to the invention, which is configured for applications in semiconductor processing. The holding apparatus 100 comprises a base body 10 and an electrode device 20. The base body 10 is constructed with a first plate 10A and a second plate 10B. The second plate 10B contains temperature control media lines 16, and it is configured for example in the manner described in U.S. Pat. No. 9,673,079 B1. U.S. Pat. No. 9,673,079 B1 is incorporated by reference into the present description in relation in particular to the construction of the base body and the connection of the holding apparatus with a voltage source.

The first plate 10A has on its top side projecting upper burls 11, the plane front surfaces 12 of which span a burl support plane for a silicon wafer 1. The burls 11 have for example the shape of cuboids, cylinders, pyramids, cones, truncated pyramids and/or truncated cones, preferably with a height in the range from 100 µm to 300 µm, in particular 150 µm, a diameter in the range from 50 µm to several mm and a mutual spacing from one to several mm. In a practical example 40,000 burls 11 are provided. The burl base 13 between the burls 11 is roughened (see FIG. 2A).

The electrode device 20 comprises a layer construction with a lower plastic insulating layer 21, a central electrode layer 22 and an upper dielectric layer 23, which is arranged partially embedded into the insulating layer 21. The plastic layer 21 is made of a curable plastic. Preferably a plastic is provided, which can be liquid or flowable or pasty through the provision of solvent and/or through a temperature setting and/or through irradiation, e.g. IR irradiation, and/or a temperature-induced polymerization, and can be transformed into the solid state through solvent extraction and/or temperature control and/or irradiation e.g. with UV light. The plastic is electrically insulating, such that preferably no or only a negligibly small electrical leakage current arises from the electrode layer 22 to the base body 10. Moreover the plastic has preferably no curing shrinkage or curing shrinkage that is negligible for the application and/or no or negligible moisture absorption/release. A preferred example of a plastic for the insulating layer 21 is benzocyclobutene (BCB), which is mentioned also in US 2012/0274920 A1, or prepolymerized BCB. Alternatively the plastics from the groups of the parylenes, polyimides or polyethylene terephthalates, which are mentioned in US 2009/0079525 A1 or US 2013/0308116 A1, can be used. The thickness of the insulating layer 21 between the electrode layer 22 and the burl base 13 is e.g. 40 µm.

The electrode layer comprises at least one electrode, which is connected with a voltage source (not represented) via a conductor path. The electrode layer 22 is formed for example of polysilicon, gold, chromium or aluminum with a thickness of e.g. 300 nm. The configuration of the at least one electrode is performed e.g. with the use of a locally selective deposition method (in particular vapor deposition with the use of masks) and/or a subsequent etching method.

The dielectric layer 23 is formed of an alkali-ion-free glass, like for example Eagle XG glass (product name), with a thickness in the range from 50 µm to 200 µm, in particular 110 µm.

The overall thickness of the electrode device 20 is chosen, such that a gap spacing A, for example in the range from 5 µm to 20 µm, is formed between the top side of the dielectric layer 23 and the burl support plane. The gap spacing A is constant over the entire area of the holding apparatus 100. The setting of the gap spacing A takes place through the partial embedding of the dielectric layer 23 into the insulating layer 21 using one of the methods illustrated in FIGS. 2 and 3.

Figure 2:
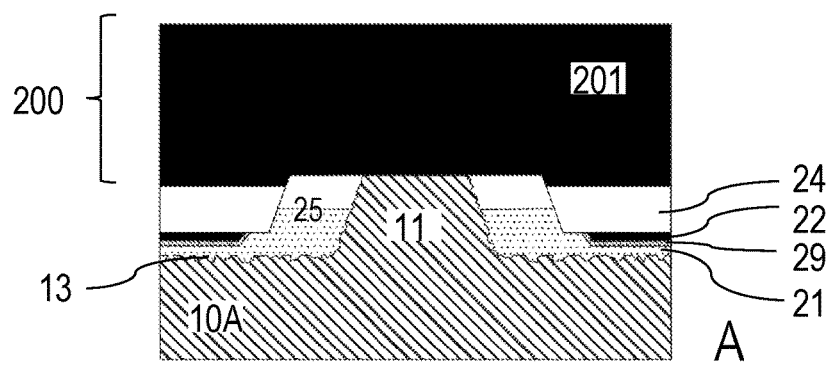
FIG. 2: a schematic illustration of the production of the holding apparatus according to the first embodiment of the method according to the invention.
Figure 2:
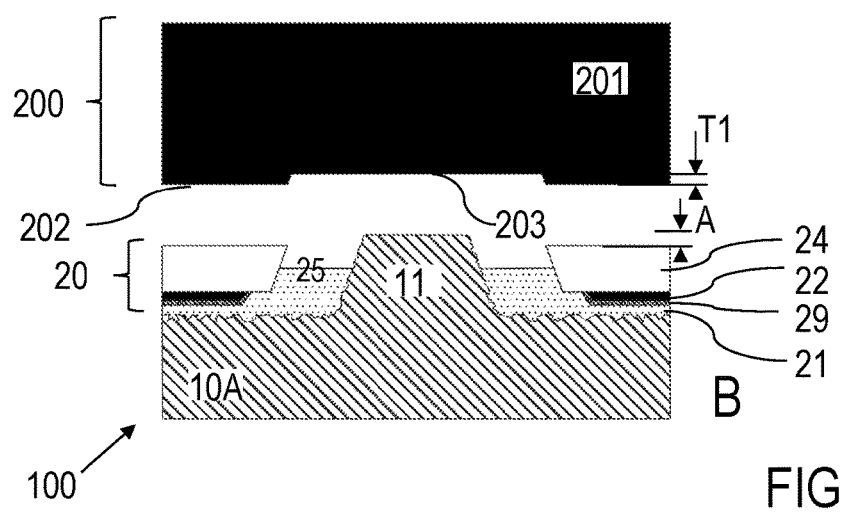

In the first embodiment of the method according to the invention illustrated schematically in FIG. 2 with a single burl, a reference tool 200 is used to set the gap spacing A. The reference tool 200 is represented only partially in FIG. 2. It comprises a reference body (stamp) 201, on the underside of which a plane reference surface 202 with sunken flat support sections 203 is provided (see in particular FIG. 2B). The support sections 203 are arranged parallel to the reference surface 202. The depth T1 of the support sections 203 relative to the reference surface 202 is chosen depending on the geometry of the base body 10, in particular of the burls 11, the desired thickness of the electrode device 20 and the desired gap spacing A. The depth T1 is e.g. 5 µm to 20 µm. The support sections 203 have a geometrical arrangement corresponding to the geometrical arrangement of the burls 11 of the base body. The diameter of the preferably circular depressions, on which the support sections 203 are formed, is preferably chosen larger than the largest diameter of the burls 11 and is e.g. 100 µm to several mm. Notwithstanding the first embodiment shown in FIG. 2 the support sections 203 can preferably be provided centrally with protruding projections (known as counter-burls), as described below with reference to FIG. 3A. Further components of the reference tool 200, which are not shown in FIG. 2, comprise a support platform for the base body and a holder of the reference body 201 with a translation mechanism for moving the reference body 201 perpendicular to the extension of the reference surface 202 towards the base body on the support platform and optionally also for lateral adjustment. The reference tool 200 can be designed for operation under standard conditions (room temperature/atmospheric pressure) or in an oven, in particular under a vacuum.

For the production of the holding apparatus 100 the base body and a dielectric disc 24 are first manufactured or provided separate from each other. The production of the base body takes place according to US2016/0354864, in particular with the provision of a ceramic plate 10A (see FIG. 1) with the projecting burls 11. On the burl base 13 the base body is roughened and/or provided with SiC enrichment, as a result of which advantageously the adhesion of the insulating layer 21 is enhanced. The burls 11 have plane front surfaces 12, which span the burl support plane. The burl support plane extends parallel to the burl base between the burls. Advantageously the perpendicular spacing between the burl support plane and the burl base is settable with high accuracy (better than 1 to 2 µm). The front surfaces 12 can have a surface roughness.

The dielectric disc 24 is a shape-retentive, self-supporting disc of glass, e.g. of the type Eagle XG or Schott AF32 (product names) with a constant thickness of e.g. 110 µm. On one side the dielectric disc 24 carries the electrode layer 22, which can be covered with an adhesion-promoter layer 29. The electrode layer 22 comprises e.g. Cr or Al, in particular with a thickness in the range from 100 nm to 500 nm. The adhesion-promoter layer 29 comprises e.g. $SiO_2$ or $Si_3N_4$, in particular with a thickness in the range from 10 nm to 1 µm. The dielectric disc 24 has recesses 25 in the form of through holes. The arrangement of the recesses 25 is the same as the arrangement of the burls 11. The diameter of the recesses 25 is chosen larger than the largest diameter of the burls 11, e.g. in the range from 100 µm to several mm. As represented in FIG. 2, the inner surfaces of the recesses 25 can be beveled or alternatively aligned perpendicular to the extension of the dielectric disc 24, to match the external shape of the burls 11.

For the production of the holding apparatus 100 the dielectric disc 24 is connected with the reference surface 202. In this regard the recesses 25 of the dielectric disc 24 are aligned with the support sections 203. The connection of the dielectric disc 24 with the reference surface 202 takes place with the use of negative pressure or of electrostatic holding forces of the reference tool 200 or through contact bonding. To facilitate detachment of the reference tool 200 from the holding apparatus 100, a non-stick coating (not represented) can be provided on the reference surface 202.

In a preparatory step, for connection of the dielectric disc 24 with the base body 10, the surface of the base body 10 with the burls 11 and/or the lower surface of the dielectric disc 24 on the reference tool 200, optionally including the support sections 203, is coated with the plastic, e.g. BCB or one of the plastics mentioned in US 2009/0079525 A1 or US 2013/0308116 A1. The plastic is first in a liquid state, which is set e.g. with a solvent. After the coating with the liquid plastic the solvent is eliminated through heating of the base body 10A and/or of the reference tool 200 with the dielectric disc 24, e.g. in an oven, such that the remaining plastic layer is solid, but still ductile. In this state both mating parts can be aligned relative to each other and placed one on the other.

Thereafter the composite comprising the base body 10 and the reference tool 200 with the dielectric disc 24 is subjected to a negative pressure, e.g. in a vacuum oven. Air pockets in the composite are removed through the action of the negative pressure.

After that, whilst the negative pressure is retained, the temperature is increased, such that the plastic becomes liquid. For example at a temperature of approx. 150° C. the plastic BCB becomes liquid, similar to water. The mating parts are pressed together (FIG. 2A) with a weight or the translation mechanism of the reference tool 200, whereby the support sections 203 lie directly on the front surfaces 12 of the burls 11. The dielectric disc 24 is pushed into the plastic layer, whereby the plastic is displaced in lateral directions and into the recess 25. Because the reference tool 200 is arranged on the front surfaces 12 of the burls 11 and the dielectric disc 24 is firmly connected with the reference surface 202, the gap spacing A is set with high accuracy and constancy over the entire area of the holding apparatus.

After the pressing of the mating parts the temperature is retained or increased, such that the plastic cures and the insulating layer 21 is formed. For example at a temperature in the range from 250° C. to 300° C. a polymerization can be triggered. Any excess remains of the plastic in the spacing between the burls 11 and the dielectric disc 24 can be removed subsequently, e.g. through etching.

As a result the dielectric disc 24 forms the finished dielectric layer 23 of the electrode device 20. Thereafter finishing of the surface of the holding apparatus, e.g. the application of a cover layer 15 on the burls 11 (see FIG. 4) can be provided.

Figure 3:
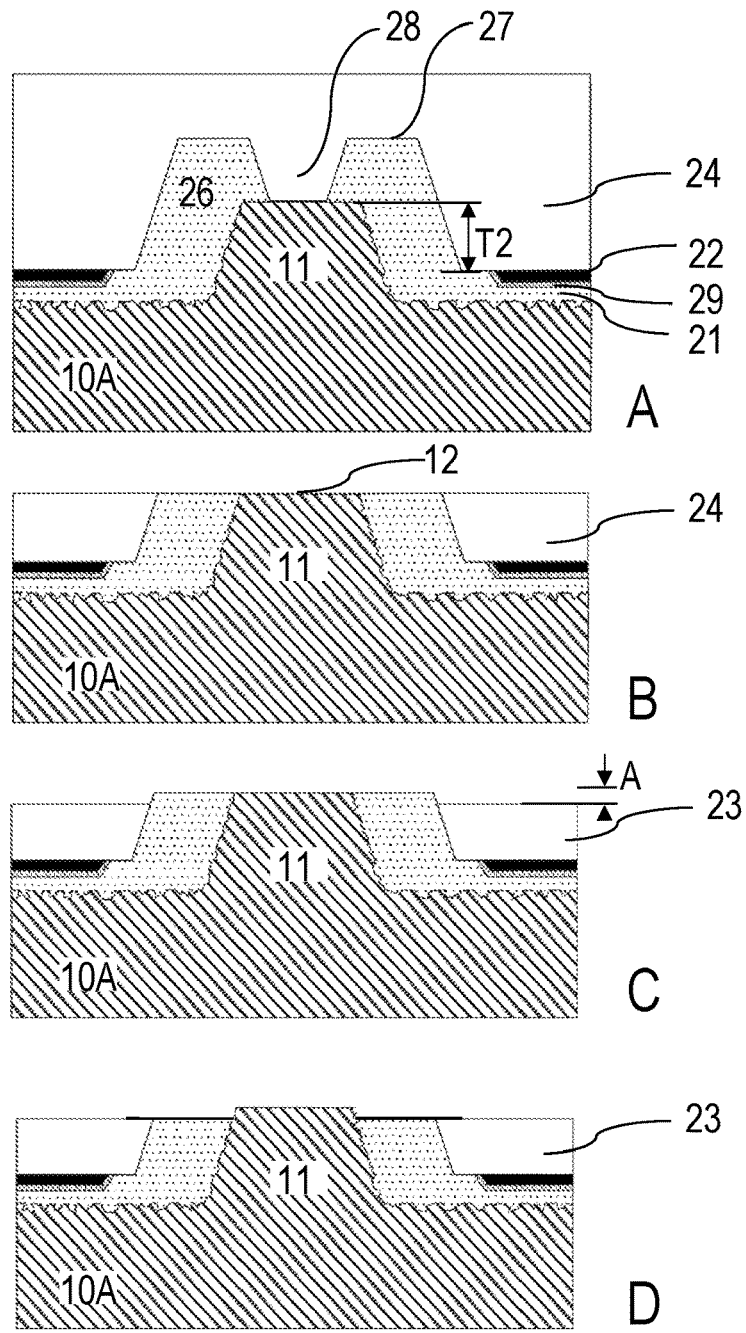
FIG. 3: a schematic illustration of the production of the holding apparatus according to the second embodiment of the method according to the invention.

In the second embodiment of the method according to the invention shown schematically with a single burl in FIG. 3 the alignment of the dielectric layer 23 relative to the burl support plane takes place with the setting of the gap spacing A without a reference tool. In this case a structured dielectric disc 24 forms a reference, as is described below.

First the base body, in particular the plate 10A (see FIG. 1) with the burls 11 and the dielectric disc 24 with the electrode layer 22 and the adhesion-promoter layer 29 are provided as separate components. In the second embodiment of the method according to the invention a dielectric disc 24 is used, the recesses 26 of which comprise depressions on the side of the dielectric disc 24 provided with the electrode layer 22. Bottom surfaces 27 of the depressions preferably have projections 28, each with a flat front surface ("counter-burls"). The arrangement of the recesses 26 is the same as the arrangement of the burls 11 of the base body 10. The diameters of the recesses 26 are chosen larger than the largest diameter of the burls 11 and e.g. in the range from 100 µm to several mm. The size of the front surfaces of the projections 28 (as represented) can be smaller than the front surface 12 of the burls 11. Advantageously in this case the contact area between the burls and the dielectric disc is minimized. Alternatively both front surfaces can have the same size, or the front surface 12 can be smaller than the front surface of the projection 28.

The front surfaces of the projections 28 run parallel to the extension of the dielectric disc 24, in particular parallel to the surface provided with the electrode layer 22. The depth T2, i.e. the perpendicular spacing of the front surfaces of the projections 28 from the surface of the dielectric disc 24, is chosen depending on the height of the burls 11. The depth T2 is chosen in particular, such that, when the projections 28 lie on the burls 11, a spacing for the formation of the insulating layer 21 remains between the electrode layer 22 and the burl base 15. The production of the structured dielectric disc 24 takes place e.g. by means of laser ablation, whereby the depth T2 is settable advantageously with an accuracy better than 1 μm.

For the production of the holding apparatus according to the invention a layer of liquid plastic is applied onto the surface of the plate 10A of the base body with the burls 11 and/or onto the structured surface of the dielectric disc 24 in a preparatory step. The plastic is for example, as in the first embodiment, the polymer BCB in a liquid state, which is set e.g. with a solvent. After the coating the solvent is eliminated through heating of the plate 10 A of the base body and/or of the dielectric disc 24, e.g. in an oven, such that the remaining plastic layer is solid, but still ductile. In this state both mating parts can be aligned relative to each other and placed one on the other.

Thereafter the composite comprising the base body 10A and the dielectric disc 24 is subjected to a negative pressure, e.g. in a vacuum oven. Air pockets in the composite are removed through the action of the negative pressure.

After that, whilst the negative pressure is retained, the temperature is increased, such that the plastic becomes liquid. For example at a temperature of approx. 150° C. the plastic BCB becomes liquid, similar to water. When the plastic has melted, the dielectric disc 24 rests, floating on the burls 11. For correct alignment of the dielectric disc 24 in lateral direction, i.e. parallel to the burl support plane, lateral mechanical fences can be provided on the edge of the base body (not represented) and/or an actuating device can be provided to position the dielectric disc 24 in lateral direction, e.g. with a control loop using an optical measuring device. The mating parts are pressed together (FIG. 3A) with a weight or the translation mechanism, whereby the projections 28 lie directly on the front surfaces 12 of the burls 11, such that the plane of the electrode layer is aligned precisely to the plane of the burl front surface. The dielectric disc 24 is pushed into the plastic layer, whereby the plastic is displaced in lateral directions and into the recess 26. After the pressing of the mating parts the temperature is increased, such that the plastic cures and the insulating layer 21 is formed.

Thereafter the finishing steps illustrated schematically in FIGS. 3B to 3D take place, to set the gap spacing A. First a removal of the dielectric disc 24 takes place, until the front surfaces 12 of the burls 11 are exposed (FIG. 3B). This removal is performed preferably by means of an abrasive method such as grinding and/or polishing. Because the material of the dielectric disc 24 is softer than the material of the burls 11, the burls 11 can be used directly as reference during the removal of the dielectric disc 24. The dielectric disc 24 is thinned uniformly, until the front surfaces 12 of the burls 11 are exposed (FIG. 3B).

After that a selective etching of the material of the dielectric disc 24 takes place, to complete the dielectric layer 23 with the setting of the gap spacing A (FIG. 3C). The etching is performed e.g. by means of wet-chemical etching with HF. For this the gap spacing A is advantageously settable with an accuracy below 200 nm. The etching does not act on the protruding plastic of the dielectric layer 23, so the burl 11 is embedded laterally in the plastic.

Finally, optionally, a removal of the remaining plastic down to the level of the top side of the dielectric layer 23 (FIG. 3D) can take place. The removal is performed e.g. by means of mechanically acting methods, chemical methods or laser ablation. Alternatively plastic can be removed further in the spacings between the burls 11 and the dielectric layer 23 (see FIG. 2B).

The production of a holding apparatus provided on both sides with burls and respectively one electrode device can take place in such a way, that plates (e.g. 10A, see FIG. 1) are first provided with the electrode device 20 and are thereafter connected to the base body 10.

Alternatively it would also be possible to join plates 10A and 10B together, to structure both sides with burls and thereafter to bond the electrode device 20 onto the respective sides one after the other or simultaneously.

Figure 4:
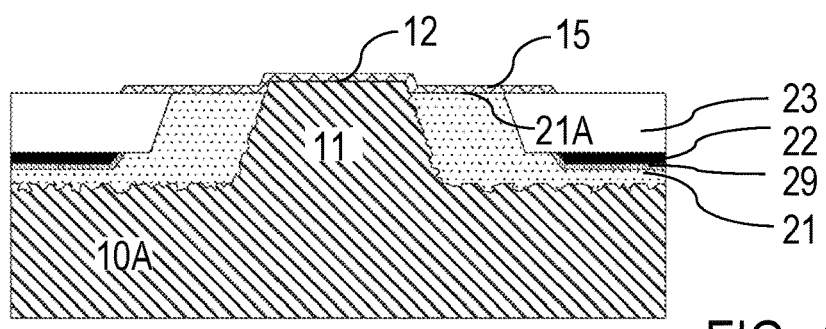
FIG. 4: a schematic illustration of the formation of a cover layer.

FIG. 4 shows schematically the optionally provided provision of a cover layer 15 on the front surfaces 12 of the burls 11. The cover layer 15 consists e.g. of DLC with a thickness of 1 μm. Preferably the cover layer 15 extends not only on the front surfaces 12, but also over the adjacent edge sections 21A of the plastic of the insulating layer 21 as far as the dielectric layer 23. Advantageously the covering of the plastic provides an additional protection of the insulating layer 21.

According to a further variant of the invention the holding apparatus can be modified, such that there is provided on the dielectric layer 23 at least one further functional layer, which fulfils e.g. a protective function. In this case the topmost, exposed surface of the further layer is considered as the top side of the dielectric layer, which determines the gap spacing of the holding apparatus.

The features of the invention disclosed in the above description, the drawings and the claims can be of significance both individually and also in combination or subcombination for the realization of the invention in its various embodiments.

What is claimed is:

1. A holding apparatus, which is configured for electrostatic holding of a component, comprising:
   a plate-shaped base body with a plurality of projecting burls, front surfaces of which span a burl support plane for the component, and
   an electrode device, which is arranged in layered form in spacings between the burls and has a plastic insulating layer, which is connected with the base body, an electrode layer and a dielectric layer, wherein the electrode layer is arranged between the insulating layer and the dielectric layer, wherein
   the dielectric layer is formed of a shape-retentive and self-supporting dielectric disc,
   a predetermined gap spacing is set between the burl support plane and a top side of the dielectric layer, and
   the dielectric layer comprises an inorganic dielectric and is embedded at least in part into the insulating layer.

2. The holding apparatus according claim 1, wherein the burls protrude through holes in the dielectric layer, wherein a lateral spacing is formed between the dielectric layer and the burls.

3. The holding apparatus according to claim 1, wherein the base body has in spacings between the burls a roughness, which is determined by at least one of projecting unevennesses with a height less than a thickness of the insulating layer and adhesion-promoting depressions in the base body.

4. The holding apparatus according to claim 1, wherein the base body comprises Si-infiltrated SiC and has carbon enrichment on its top side in the spacings between the burls.

5. The holding apparatus according to claim 1, further comprising a cover layer, which is arranged on the burls and on edge sections of the insulating layer, which abut the burls.

6. The holding apparatus according to claim 1, wherein the electrode layer is connected with the insulating layer by way of an adhesion-promoting surface.

7. The holding apparatus according to claim 6, wherein the electrode layer is connected with the insulating layer by way of an adhesion-promoter layer.

8. The holding apparatus according to claim 1, wherein the holding apparatus is configured for electrostatic holding of a silicon wafer.

9. A method for the production of a holding apparatus, which is configured for electrostatic holding of a component, comprising the steps:
provision of a plate-shaped base body with a plurality of projecting burls, front surfaces of which span a burl support plane for the component, and
production of an electrode device in spacings between the burls, wherein a plastic insulating layer, which is connected with the base body, an electrode layer and a dielectric layer is formed, wherein the electrode layer is arranged between the insulating layer and the dielectric layer, wherein
a predetermined gap spacing is set between the burl support plane and a top side of the dielectric layer, wherein
the production of the electrode device comprises the steps of:
provision of a shape-retentive and self-supporting dielectric disc from an inorganic dielectric, wherein the dielectric disc has recesses, which are arranged to receive the burls, and on one side the electrode layer,
coating at least one of the base body with the burls and the side of the dielectric disc provided with the electrode layer with a flowable, curable plastic,
placing of the dielectric disc onto the base body, wherein the burls protrude into the recesses of the dielectric disc, the side of the dielectric disc provided with the electrode layer is aligned relative to the burl support plane and the dielectric disc is embedded at least in part into the plastic, and
formation of the plastic insulating layer through a curing of the plastic.

10. The method according to claim 9, wherein:
the recesses comprise through-holes in the dielectric disc, the placing of the dielectric disc onto the base body takes place with a reference tool with a reference surface with sunken support sections facing the base body, and
the dielectric disc is aligned relative to the burl support plane by the dielectric disc being connected with the reference surface and the reference tool being put onto the base body, such that the support sections lie on the burls at the through-holes of the dielectric disc.

11. The method according to claim 10, wherein the dielectric disc forms the dielectric layer.

12. The method according to claim 9, wherein:
the recesses comprise depressions in the side of the dielectric disc provided with the electrode layer, wherein the depressions have bottom surfaces, which extend parallel to an extension of the dielectric disc,
the dielectric disc is aligned relative to the burl support plane through the placing of the dielectric disc with the bottom surfaces onto the burls, and
after the curing of the plastic the dielectric layer is formed through removing the dielectric disc, until the burls are exposed and the gap spacing is formed.

13. The method according to claim 12, wherein:
the bottom surfaces have projections with plane front surfaces, which extend parallel to the extension of the dielectric disc, and
the dielectric disc is aligned relative to the burl support plane through the placing of the dielectric disc with the projections of the floor surfaces onto the burls.

14. The method according to claim 12, wherein the dielectric disc is removed first by way of an abrasive method with the burls as reference, until the burls are exposed, and is removed thereafter by way of an etching method, in order to set the gap spacing.

15. The method according to one of claim 12, wherein edge sections of the insulating layer, which abut the burls, are removed, such that a spacing is formed between burl support plane and the surface of the edge sections of the insulating layer.

16. The method according to claim 9, having at least one of the steps:
formation of the base body in the spacings between the burls with a roughness which is determined by at least one of projecting unevennesses with a height less than a thickness of the insulating layer and adhesion-promoting depressions in the base body,
production of the base body from Si-infiltrated SiC and carbon enrichment in the spacings between the burls, and
formation of a cover layer, which is arranged on the burls.

17. The method according to claim 9, wherein the holding apparatus is configured for electrostatic holding of a silicon wafer.

* * * * *